United States Patent
Bollinger et al.

(10) Patent No.: US 6,893,806 B2
(45) Date of Patent: May 17, 2005

(54) MULTIPLE PURPOSE RETICLE LAYOUT FOR SELECTIVE PRINTING OF TEST CIRCUITS

(75) Inventors: Cheryl Anne Bollinger, Orlando, FL (US); Seungmoo Choi, Allentown, PA (US); William T. Cochran, Clermont, FL (US); Stephen Arlon Meisner, Allen, TX (US); Daniel Mark Wroge, Allentown, PA (US); Gerard Zaneski, Macungie, PA (US)

(73) Assignee: Agere Systems, Inc., Allentown, PA (US)

( * ) Notice: Subject to any disclaimer, the term of this patent is extended or adjusted under 35 U.S.C. 154(b) by 257 days.

(21) Appl. No.: 10/219,951

(22) Filed: Aug. 15, 2002

(65) Prior Publication Data

US 2003/0039928 A1 Feb. 27, 2003

Related U.S. Application Data

(60) Provisional application No. 60/312,389, filed on Aug. 15, 2001.

(51) Int. Cl.⁷ .................................................. G03F 9/00
(52) U.S. Cl. ......................... 430/394; 430/5; 430/311; 430/397
(58) Field of Search ........................... 430/374, 5, 311, 430/22

(56) References Cited

U.S. PATENT DOCUMENTS

| | | | |
|---|---|---|---|
| 4,748,478 A | 5/1988 | Suwa et al. | |
| 4,758,863 A | 7/1988 | Nikkel | |
| 5,049,925 A | 9/1991 | Aiton et al. | |
| 5,705,299 A | 1/1998 | Tew et al. | |
| 6,001,512 A | * 12/1999 | Tzu et al. | 430/5 |
| 6,040,892 A | 3/2000 | Pierrat | |
| 6,136,517 A | 10/2000 | Fletcher | |
| 6,421,111 B1 | 7/2002 | Pierrat | |

* cited by examiner

*Primary Examiner*—Amanda Walke

(57) ABSTRACT

A method for manufacturing a semiconductor wafer uses a reticle having a plurality of spaced apart circuit images of identical patterns or images of a common level of a single integrated circuit formed on the reticle and arranged in columns and rows about its central point. At least one column of spaced apart test images are formed outside of and adjacent an outermost column of circuit images. Radiation is projected through the reticle for exposing the patterns on the reticle onto an underlying wafer. A reticle holder having a pair of shutter elements aligned parallel to the columns of images selectively blocks the projection of radiation through the columns of the test images but are exposed in order to form test circuits on the wafer at selected locations.

2 Claims, 3 Drawing Sheets

MULTIPLE PURPOSE RETICLE LAYOUT FOR SELECTIVE PRINTING OF TEST CIRCUITS

SPECIFIC DATA RELATED TO THE INVENTION

This application claims the benefit of U.S. provisional application, Ser. No. 60/312,389, filed Aug. 15, 2001.

BACKGROUND OF THE INVENTION

The present invention relates to manufacture of semiconductor integrated circuits and, more particularly, to lithographic techniques for increasing available product space on a semiconductor wafer.

Semiconductor integrated circuits are commonly built on a wafer or substrate by deposition of conductive layers separated by non-conductive layers with each conductive layer being patterned to establish desired conductive paths or traces. The patterns of traces are often defined by photolithographic processes in which a radiation sensitive or photo-resist layer is spread over the conductive layer and exposed to appropriate radiation—light, UV, x-ray, for example—through a patterned mask formed on a reticle.

Each wafer is typically physically larger than an integrated circuit being created and is therefore dividable into multiple areas or dies with each die forming a single integrated circuit. Generally, each integrated circuit formed on a wafer is identical, i.e., all SRAM or all DRAM or some other type circuit. However, it is also common to form test circuits on the wafer in order to verify that the circuit forming process is proceeding properly.

One process of circuit formation uses reticles having multiple images so that multiple dies are concurrently exposed. A stepper is used to accurately position the reticle with respect to the wafer for each succeeding exposure. With this process, a different reticle is required for each layer forming the integrated circuit. Another process uses a reticle with multiple images in which each image corresponds to a layer or level of circuit formation. In this latter process, only one circuit is exposed at a time with the remaining images being blocked by shutters. Such a process is described in U.S. Pat. No. 6,040,892. Both of these processes use multiple images on a single reticle to address the high cost of multiple, complex reticles.

There is a further problem not addressed by the above described processes in that the multiple images typically include images for forming test circuits. The test circuits are larger than the product circuits and consume substantial space on each wafer, particularly since each exposure of a reticle produces another test circuit. Reducing the number of test circuits would therefore produce higher product yield per wafer and reduce manufacturing cost.

SUMMARY OF THE INVENTION

The present invention addresses the above and other issues of the prior art by providing a method for utilizing a single reticle having both integrated circuit design patterns or images and test circuit patterns or images on the same reticle. The invention takes advantage of the capability of existing reticle based exposure equipment to control the exposure aperture and selectively block exposure of test circuits during fabrication of semiconductor devices. More particularly, the invention utilizes the shuttering capability of such exposure equipment to move the shutters of the equipment into a position to block radiation through the test circuits. In this manner, the exposure equipment can be used to expose a wafer to desired integrated circuit patterns in any combination and to selectively insert test circuits onto the wafer at other desired locations. This arrangement has the advantage of utilizing a single reticle for both circuit development and test functions while enabling the test functions to be implemented in selected areas of the wafer. In one form, the inventive method comprises creation of a reticle having a plurality of spaced apart integrated circuit images of identical patterns of a common level of a single circuit formed on the reticle and arranged in columns and rows about a central point of the reticle. Test images are then formed outside of the columns or rows of the desired circuit images and spaced apart from the columns or rows so that the test images can be blocked by shutters on the commercial reticle exposure equipment. When radiation (light, UV, X-ray, etc.) is subsequently projected through the reticle for exposing patterns on the reticle onto an underlying wafer, the shutters of the exposure equipment can be positioned to selectively block the projection of radiation through the columns or rows of test images. The reticle or wafer can then be moved in a stepwise fashion so as to continue to expose the entire surface of the wafer to the desired images. The shutters may be opened to allow the test images on the reticle to be exposed to create test circuits at any desired point on the wafer surface. Alignment marks may also be exposed on the wafer to facilitate alignment of the reticle for each subsequent exposure as the reticle is stepwise moved with respect to the wafer.

The invention further comprises the construction of a reticle for selectively exposing test circuits on a semiconductor wafer in which the reticle is formed by establishing a plurality of rows and columns of integrated, separated circuit patterns formed centrally on the reticle and then forming at least one column of test circuit patterns along at least one edge of the column of integrated circuit patterns.

BRIEF DESCRIPTION OF THE DRAWINGS

For a better understanding of the present invention. reference may be had to the following detailed description taken in conjunction with the accompanying drawings in which.

DETAILED DESCRIPTION OF THE INVENTION

Figure 1:
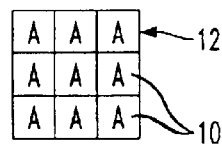
FIG. 1 is a plan view representative of a conventional layout of circuit patterns on a reticle.
Figure 2:
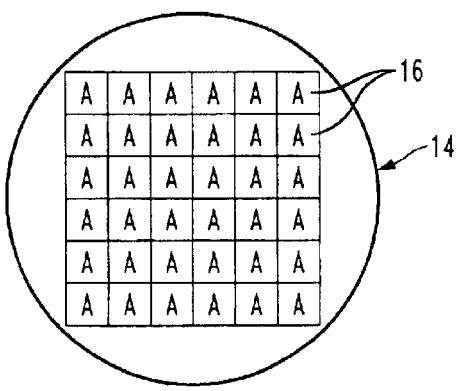
FIG. 2 is a plan view of a wafer representing four stepwise exposures of the reticle of FIG. 1 and the resultant formation of the circuit patterns of FIG. 1 onto the wafer surface.

The present invention provides a method and apparatus for forming multiple circuit patterns on a single wafer and selectively positioning test circuits on the wafer to verify correct processing of the wafer using a single reticle. In conventional processing of semiconductor wafers during manufacture of semiconductor circuits, a reticle having a plurality of identical images is positioned in a reticle based exposure system above a silicon wafer and a source of appropriate radiation is utilized to expose the image patterns on the reticle onto the wafer. Because of the extremely small size of the circuits that are being produced and the resolution that is required to produce miniscule features on the semiconductor wafer, current practices require that a limited amount of the wafer be exposed at any one time. Consequently, the exposure equipment is coordinated with a stepper drive to sequentially step the reticle so that a different portion of the wafer is exposed in sequential fashion to the patterns that are formed on the reticle. FIG. 1 illustrates a typical arrangement of integrated circuit patterns or images 10, each separate image being indicated by the letter A, so that the reticle can be positioned over a wafer, and in this particular instance, nine separate images or patterns can be exposed at one time through the reticle 12. The reticle, or the wafer, can be stepwise moved with respect to each other so that a plurality of exposures will result in arrangement of images formed on the wafer surface 14 as shown in FIG. 2. In this particular example, the reticle may be moved through four separate locations to thus form 36 separate circuits 16 on the wafer 14.

Figure 3:
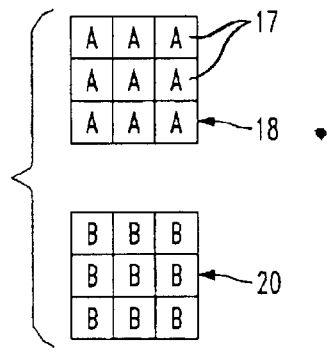
FIG. 3 represents a pair of reticles with one reticle representing desired circuit patterns to be formed on a wafer surface and the second reticle representing test circuits that are to be exposed on the wafer surface.
Figure 4:
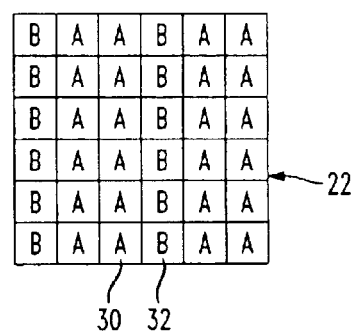
FIG. 4 represents a pattern of integrated circuit patterns and test circuit patterns that may be formed on a wafer surface by alternate use of the two reticles of FIG. 3 in conjunction with shuttering of the patterns on each of the reticles to form the selected columns of circuit patterns and test circuits.

In conventional manufacturing processes, verification of the processing of complex integrated circuits is necessary to assure that each step of the multistep process is progressing properly. Accordingly, it is common to use a test reticle to form test circuits on the silicon wafer at selected locations so that the test circuit can be used to verify that the wafer is being properly processed. FIG. 3 illustrates a typical test reticle having the same number of patterns or images 17 formed on the reticle 18 as is used in the conventional integrated circuit pattern reticle 12. However, it will be appreciated that test circuits may be of different size and the pattern is only illustrative of one form of test circuit. In order to create the test circuits on the semiconductor wafer in conventional practice, the reticle of FIG. 1 is replaced in the reticle based exposure equipment by the reticle 20 of FIG. 3. The shutters of the equipment are then adjusted to selectively print the test circuit diagrams, each of which is indicated at B in FIG. 3 onto the wafer 22 in various forms such as that shown in FIG. 4. There are various types of reticle based exposure equipment that are commercially available such as, for example, the ASM5X Wafer Stepper manufactured by ASM Lithography of the Netherlands. The ASM stepper includes an XY plane optical aperture blocking system which allows arbitrary rectangular portions of the reticle to be blocked off while the exposed image portion of the reticle is used to pattern the wafer during a particular wafer processing step. The drop-in procedure allows production of an exposed wafer of the form shown in either FIG. 2 or FIG. 4, depending upon whether the entire wafer is exposed with the desired integrated circuit pattern or if the wafer also includes test circuits 'B' such as shown in FIG. 4.

Figure 5:
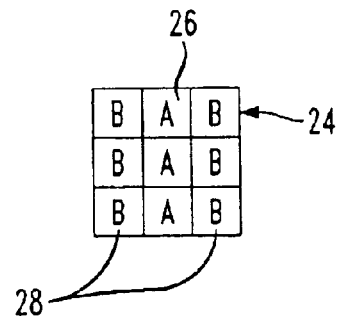
FIG. 5 illustrates one form of reticle pattern layout in accordance with the present invention.

The present invention avoids the necessity for having separate reticles for test circuits and reduces the manufacturing time associated with changing reticles and realigning the exposure equipment. FIG. 5 illustrates one form of reticle 24 in accordance with the present invention. In the embodiment of FIG. 5, the reticle is formed with a single column of desired integrated circuit patterns 26, each of which is indicated by the letter 'A'. On the outboard sides of the column of integrated circuit patterns there are formed columns of test patterns 28, each separate test pattern being indicated by the letter 'B'. The reticle of FIG. 5 can be used to form either the circuit pattern of FIG. 2 or the circuit pattern of FIG. 4. In forming the pattern shown in FIG. 2, the exposure equipment is shuttered so that only the column of integrated circuit patterns 'A' are exposed and the reticle is stepwise moved across the surface of the wafer to create a complete pattern of circuits A over the face of the wafer. To form the pattern of FIG. 4, the initial column of test circuits can be created by shuttering the reticle so as to shutter all but one column of test circuits 'B' and then exposing the test circuits along one edge of the wafer in two steps. Thereafter, the exposure equipment shutters can be adjusted to only allow exposure of the integrated circuit patterns 'A' so as to form the two columns of circuits 'A' as shown in FIG. 4. Alternately, both the first column of test circuits 'B' and integrated circuits 'A' could be formed in a single exposure process by blocking the exposure through the right hand column of test circuits 28. Similarly, the next pair of columns of wafer 22, in which the first column 30 has the integrated circuit patterns 'A' and the next column 32 has the test circuits 'B', can be formed by blocking the left hand column 28 of test circuits on the reticle 24 and exposing the center and right hand column. However, use of the reticle in this latter form may require offset since the typical exposure equipment shutters about a central point from both sides conjointly.

Figure 6:
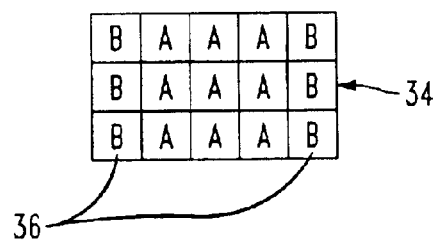
FIG. 6 illustrates another pattern of integrated circuit images and test circuit images that may be formed on a reticle in accordance with another aspect of the present invention.
Figure 7:
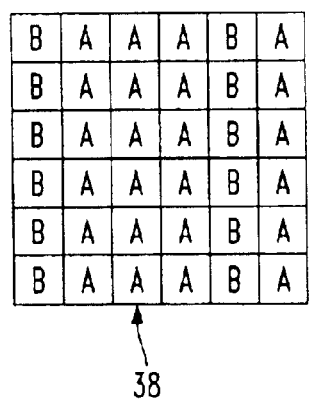
FIG. 7 illustrates the alternate embodiments of circuit patterns which may be formed on a semiconductor wafer using the reticle of FIG. 6 and the shuttering ability of the reticle based exposure equipment.
Figure 8:
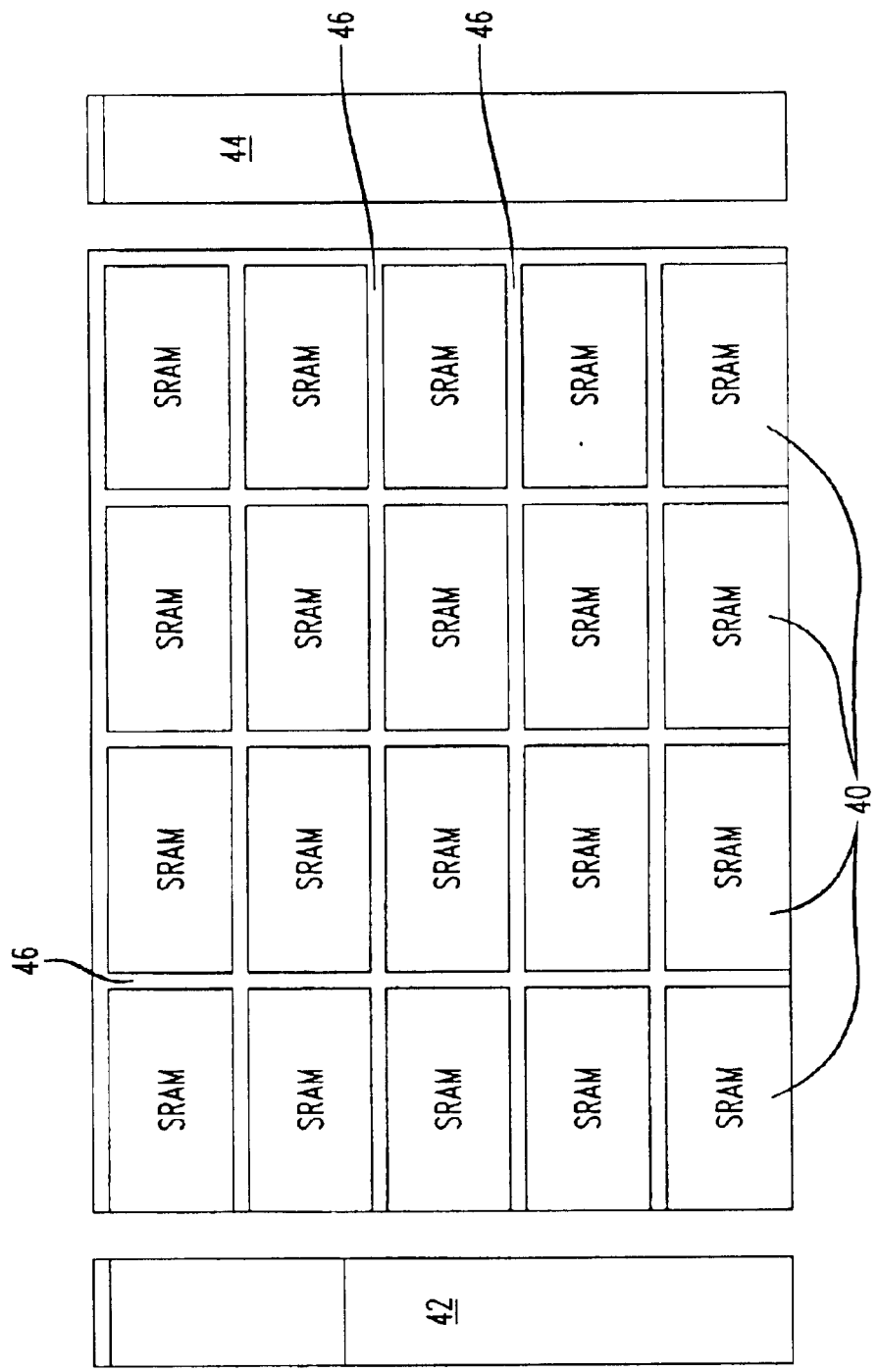
FIG. 8 illustrates a typical layout of static RAM (SRAM) devices and test circuits that may be formed using the reticle arrangements of FIGS. 5 and 6.

An alternate form of reticle 34 is illustrated in FIG. 6 in which the image pattern of FIG. 1 is expanded by adding columns 36 of test circuits on opposite sides. In using the reticle design of FIG. 6, the pattern of FIG. 7 can be created by opening the shutters to their full extent so that all of the images on FIG. 6 are simultaneously exposed on the wafer 38. The final column of integrated circuits can then be formed on the wafer by shuttering down to only the central column 30 of FIG. 6. Obviously, other patterns could be formed using the arrangement of FIG. 6 by appropriate shuttering, including forming the full exposure of integrated circuits as shown in FIG. 2. The particular setup including focusing and alignment of the reticle based exposure equipment used in semiconductor manufacturing is well known in the art and it is not believed necessary to go into a detailed description of such operation. However, FIG. 8 illustrates a more detailed layout of a typical wafer structure with SRAM circuits 40 and process testers 42, 44 formed on a wafer. As is well known, the individual SRAM circuits 40 are cut from the wafer after completion of manufacturing and it is necessary to leave slice lines or spaces 46 between the individual circuits. Each of the spaces are typically just sufficient to allow the individual circuits or dies to be separated from adjacent circuits or dies without damage to the dies. In the particular embodiment of FIG. 8, the SRAM circuits may correspond to each of the circuits A of FIGS. 5 or 6 and the test circuits may correspond to the circuits B of FIG. 5 or 6. By appropriately shuttering the various integrated circuits and test circuits, the wafer can be exposed to create a pattern of 4×5 SRAM's with process testers or test circuits located on the outboard side of the SRAM array.

While the invention has been described in a form in which all of the integrated circuit patterns on the reticle represent the same level of a particular semiconductor device, it will be apparent that the reticle could be constructed so that each image or pattern on the reticle represents a different level on a semiconductor device and only one level is stepwise exposed as the exposure equipment steps over the surface of the semiconductor wafer. In such event, the shuttering of the reticle can be adjusted so that only a single die is formed at each exposure and then the reticle is stepped to form the next die in the array of dies to be formed on the wafer surface. Thereafter, processing would continue and a second level of the device formed by exposure through another one of the images or patterns on the reticle. Accordingly, it is intended that the invention not be limited to the specific disclosed embodiment but be interpreted within the full spirit and scope of the appended claims.

What is claimed is:

1. A method for manufacturing a semiconductor wafer comprising:

creating a reticle having a plurality of spaced apart circuit images of identical patterns of a common level of a single integrated circuit formed thereon and arranged in columns and rows about a central point of the reticle;

forming at least one column of spaced apart test images outside of and adjacent each outermost column of circuit images;

a source of radiation adapted for projection through the reticle for exposing the patterns on the reticle onto an underlying substrate;

positioning the reticle in a holder having a pair of shutter elements aligned parallel to the columns of images, each shutter element being conjointly movable one towards the other and centered about the central point of the reticle for selectively blocking the projection of radiation through the columns of the test images;

sequentially exposing surfaces of the wafer to radiation projected through the reticle and periodically changing the position of the pair of shutters with respect to the reticle for forming test circuits on the wafer at selected locations.

2. A method for selectively creating test circuits on a semiconductor wafer using a reticle with a combination of integrated circuit patterns and test circuit patterns, the method comprising:

arranging the integrated circuit patterns in an array of columns and rows of separate images in a central portion of a reticle;

positioning a column of test circuit patterns along a side of the array of separate images;

positioning the reticle in a stepper apparatus having a movable shutter element blocking the test circuit patterns; and selectively adjusting the shutter element for periodically unblocking the test circuit patterns for exposing test circuits on the semiconductor wafer.

* * * * *